(12) United States Patent
Kameyama et al.

(10) Patent No.: US 7,728,438 B2
(45) Date of Patent: Jun. 1, 2010

(54) OPTICAL SEMICONDUCTOR DEVICE AND METHOD OF MANUFACTURING THE SAME

(75) Inventors: Koujiro Kameyama, Gunma (JP); Kiyoshi Mita, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 17 days.

(21) Appl. No.: 11/537,496

(22) Filed: Sep. 29, 2006

(65) Prior Publication Data
US 2007/0034995 A1 Feb. 15, 2007

Related U.S. Application Data

(62) Division of application No. 10/812,454, filed on Mar. 30, 2004, now abandoned.

(30) Foreign Application Priority Data
Jun. 5, 2003 (JP) ............... 2003-160893

(51) Int. Cl.
| H01L 23/48 | (2006.01) |
| H01L 23/52 | (2006.01) |
| H01L 29/40 | (2006.01) |

(52) U.S. Cl. ............... 257/774; 257/777; 257/E21.502
(58) Field of Classification Search ......... 257/E21.502, 257/774, 777
See application file for complete search history.

(56) References Cited

U.S. PATENT DOCUMENTS

| 5,051,802 A * | 9/1991 | Prost et al. .................. 257/434 |
| 5,399,805 A * | 3/1995 | Tyler et al. .................. 174/529 |
| 5,814,889 A * | 9/1998 | Gaul .......................... 257/773 |
| 5,818,035 A * | 10/1998 | Krivanek et al. ......... 250/208.1 |
| 6,482,730 B1 | 11/2002 | Masumoto et al. |
| 6,503,780 B1 * | 1/2003 | Glenn et al. ................ 438/116 |
| 6,671,947 B2 | 1/2004 | Bohr |
| 6,777,767 B2 * | 8/2004 | Badehi ........................ 257/432 |
| 6,833,668 B1 | 12/2004 | Yamada et al. |
| 2001/0018236 A1 * | 8/2001 | Badehi ........................ 438/127 |
| 2002/0063218 A1 | 5/2002 | Maydanich et al. |
| 2002/0081838 A1 * | 6/2002 | Bohr .......................... 438/637 |
| 2003/0099737 A1 | 5/2003 | Eldridge et al. |
| 2005/0224821 A1 | 10/2005 | Sakano et al. |

FOREIGN PATENT DOCUMENTS

| JP | 2000-173766 | 6/2000 |
| JP | 2001-339151 | 7/2001 |
| KR | 2002-0079953 | 10/2002 |

* cited by examiner

*Primary Examiner*—Bradley K Smith
*Assistant Examiner*—Alexander Belousov
(74) *Attorney, Agent, or Firm*—Fish & Richardson P.C.

(57) ABSTRACT

An optical semiconductor device of which the moisture resistance and the like are improved and the manufacturing method thereof are provided. An optical semiconductor device of the embodiment is configured to include an optical semiconductor element on a surface of which a circuit portion including a light-receiving or light-emitting element is formed; a terminal portion which is provided on a back of the optical semiconductor element and electrically connected with the circuit portion; a covering layer which covers the surface of the optical semiconductor element and is made of a transparent material; and sealing resin which covers side faces of the covering layer and of the optical semiconductor element. The circuit portion and the terminal portion may be connected by a rewiring pattern.

18 Claims, 7 Drawing Sheets

OPTICAL SEMICONDUCTOR DEVICE AND METHOD OF MANUFACTURING THE SAME

CROSS-REFERENCE TO RELATED APPLICATION(S)

This application is a divisional of U.S. Ser. No. 10/812,454, filed Mar. 30, 2004, now abandoned which in turn claims the benefit of Japanese Application No. 2003-160893 filed Jun. 5, 2003.

BACKGROUND OF THE INVENTION

1. Field of the Invention

The present invention relates to an optical semiconductor device in which an optical semiconductor element including a light-receiving or light-emitting portion is accommodated.

2. Description of the Related Art

Since circuit devices to be set in electronic equipment are used in a mobile phone, a portable computer, and the like, there has been a demand for reduction in size, thickness and weight of the circuit devices. Taking a semiconductor device as an example of the circuit devices, chip size packages (CSP) have been developed. The size of CSP is equal to chip size or, slightly larger than a chip size.

FIG. 7 shows a CSP 66 with a size slightly larger than a chip size, in which a glass epoxy substrate 65 is employed as a supporting substrate. A description will be given here assuming that a transistor chip T is mounted on the glass epoxy substrate 65.

First and second electrodes 67, 68 and a die pad 69 are formed on a surface of this glass epoxy substrate 65, and first and second back electrodes 70 and 71 are formed on a back of the glass epoxy substrate 65. The first electrode 67 and first back electrode 70, as well as the second electrode 68 and second back electrode 71, are electrically connected through a through-hole TH. The bare transistor chip T is fixed to the die pad 69. An emitter electrode of the transistor and the first electrode 67 are connected by a thin metal wire 72, and a base electrode of the transistor and the second electrode 68 are connected by another thin metal wire 72. Moreover, a resin layer 73 is provided on the glass epoxy substrate 65 so as to cover the transistor chip T.

Although the glass epoxy substrate 65 is used in the CSP 66, the CSP 66, unlike a wafer scale CSP, has a simple elongating structure from the transistor chip T up to the back electrodes 70 and 71 for external connection, and therefore has a merit of being able to be manufactured at low costs.

In the CSP 66 explained above, however, the resin layer 73 covering the transistor chip T is only in contact with a surface portion of the glass epoxy substrate 65. Accordingly, during the process of mounting the CSP 66 and/or in the state where the CSP 66 is being used, water enters from the outside into the interface between the glass epoxy substrate 65 and the resin layer 73. This fact has led to degradation in the moisture resistance of the CSP 66. Moreover, from the same reason as above, there has been a problem of weak adhesion between the glass epoxy substrate 65 and the resin layer 73.

SUMMARY OF THE INVENTION

The embodiment of the present invention was accomplished in the light of the above-mentioned problems, and a primary object of the embodiment of the present invention is to provide an optical semiconductor device of which the moisture resistance and the like are improved, and a manufacturing method thereof.

The optical semiconductor device of the embodiment of the present invention includes an optical semiconductor element having a circuit portion including any one of a light-receiving element and a light-emitting element on a surface thereof; a terminal portion which is provided on a back of the optical semiconductor element and electrically connected with the circuit portion; a covering layer which covers the surface of the optical semiconductor element and is made of a transparent material; and sealing resin which covers side surfaces of the optical semiconductor element.

The method of manufacturing the optical semiconductor device of the embodiment of present invention includes: preparing a wafer having a plurality of circuit portions each including any one of a light-receiving element and a light-emitting element on a surface thereof; separating the wafer into individual optical semiconductor elements by forming separating grooves from a back surface of the wafer so that the wafer is separated; providing terminal portions electrically connected with the circuit portions on back surface of the optical semiconductor elements; forming sealing resin so that at least the separating grooves are filled with the sealing resin; and separating individual optical semiconductor devices from each other along the separating grooves.

DETAILED DESCRIPTION OF THE PREFERRED EMBODIMENTS

Figure 1A:
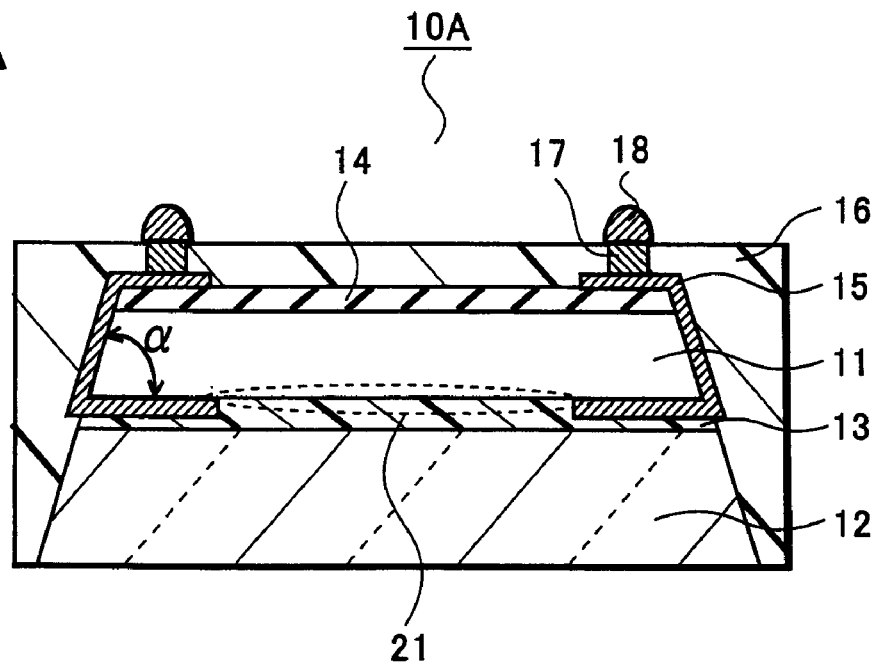
FIG. 1A is a sectional view of an optical semiconductor device of an embodiment according to the present invention.
Figure 1B:
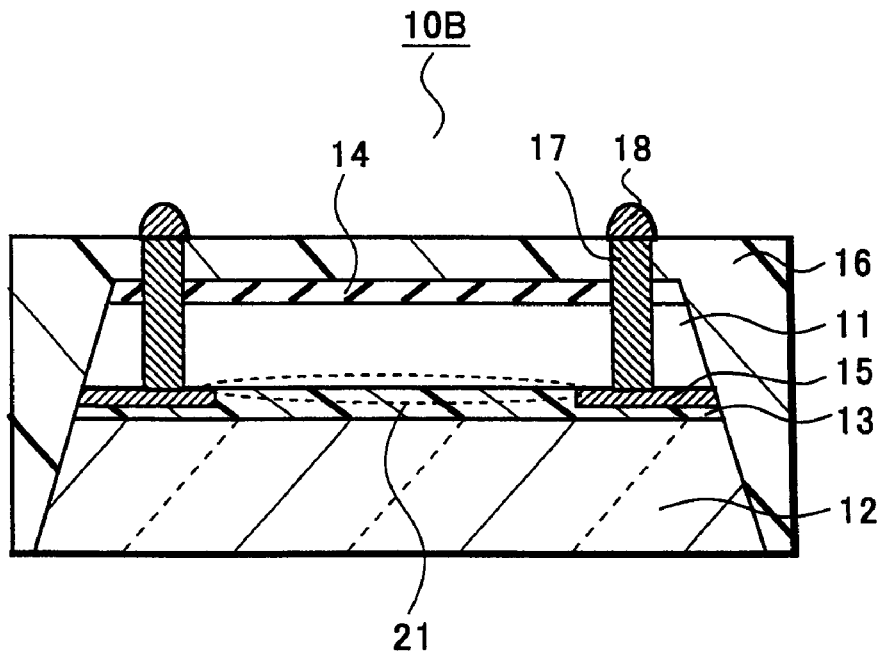
FIG. 1B is a sectional view of an optical semiconductor device according to another embodiment of the present invention.

A description will be given of a configuration of an optical semiconductor device 10 of the present embodiment with reference to FIGS. 1A and 1B. FIG. 1A is a sectional view of an optical semiconductor device 10A, and FIG. 1B is a sectional view of an optical semiconductor device 10B of another embodiment.

Referring to FIG. 1A, the optical semiconductor device 10A of the present embodiment is configured to include an optical semiconductor element 11 on a surface of which a circuit portion 21 including a light-receiving or light-emitting element is formed; terminal portions 17 which are provided on a back of the optical semiconductor element 11 and electrically connected with the circuit portion 21; a covering layer 12 which covers the surface of the optical semiconductor element 11 and is made of a transparent material; and sealing resin 16 which covers side faces of the optical semiconductor element 11. A detailed description will be given below of each of these components.

The covering layer 12 is adhered to the surface of the optical semiconductor element 11 with adhesive resin 13 interposed therebetween so as to protect the circuit portion 21 formed on the surface of the optical semiconductor element 11. For the material of the covering layer 12, a transparent material is used which transmits light to be inputted into the optical semiconductor element 11 or light emitted from the optical semiconductor element 11. For example, when the optical semiconductor element 11 is an element which detects visible light, a material with transparency to the visible light is employed as the covering layer 12. Specifically, glass, acrylic sheet, or the like can be employed as the covering layer 12. Further, when the optical semiconductor element 11 is an imaging device such as a CCD image sensor, a filter or the like is added.

For the optical semiconductor element 11, a light-receiving or light-emitting element can be employed. For the light-receiving element, a solid-state imaging device such as a charge coupled device (CCD) image sensor or complementary metal oxide semiconductor (CMOS) image sensor, or a photo sensor such as a photo diode or photo transistor can be employed as the optical semiconductor element 11. For the light-emitting element, a light-emitting diode, a semiconductor laser, or the like can be employed as the optical semiconductor element 11.

Rewiring patterns 15 are conductive patterns which electrically connect the circuit portion 21 of the optical semiconductor element 11 and the terminal portions 17 provided on the back surface of the optical semiconductor element 11. In this embodiment, Rewiring patterns detour along side surface portions of the optical semiconductor element 11, the rewiring patterns 15 electrically connect the circuit portion 21 and the terminal portions 17. For the material of the rewiring patterns 15, a metal mainly containing Cu, a metal mainly containing Al, or an alloy containing Au, conductive paste and the like is used. Moreover, a surface of each of the rewiring patterns 15 is covered with an insulating layer, thus achieving insulation from the optical semiconductor element 11.

Each of the side surface portions of the optical semiconductor element 11 is formed to be an inclined face. Specifically, an angle $\alpha$ between the main face of the optical semiconductor element 11 where the circuit portion 21 is formed and each side face portion thereof is an acute angle. This structure facilitates the formation of the rewiring patterns 15 on the side face portions of the optical semiconductor element 11, a detailed description of which will be given later in the description of the manufacturing method.

The sealing resin 16 covers the side face portions of the optical semiconductor element 11 and of the covering layer 12. Further, the back surface of the optical semiconductor element 11 is also covered with the sealing resin 16, and bump electrodes 18 are formed on the terminal portions 17 which are exposed from the sealing resin 16 at given positions. In this way, the covering layer 12 is exposed on a face of the optical semiconductor device 10A through which the optical semiconductor element 11 performs receiving light or emitting light, and the other faces of the optical semiconductor device 10A are formed of the sealing resin 16. For the sealing resin 16, it is possible to employ a light blocking material into which an inorganic filler is mixed for the improvement in mechanical strength and moisture resistance. For the inorganic filler, for example, an aluminum compound, calcium compound, kalium compound, magnesium compound, or silicon compound can be employed. For the resin used in the sealing resin 16, a thermoplastic resin or thermosetting resin can be employed generally. The thermoplastic resin applicable to the present embodiment includes, for example, ABS resin, polypropylene, polyethylene, polystyrene, acrylic, polyethylene terephthalate, polyphenylene ether, nylon, polyamide, polycarbonate, polyacetal, polybutylene terephthalate, polyphenylene sulfide, polyether ether ketone, liquid crystal polymer, fluororesin, polyurethane resin, and elastomer. The thermosetting resin applicable to the present embodiment includes, for example, urea, phenol, melamine, furan, alkyd, unsaturated polyester, diallyl phthalate, epoxy, silicon resin, and polyeurethane.

The adhesive resin 13 is made of epoxy resin or the like and has a function to adhere the covering layer 12 to the optical semiconductor element 11. Moreover, in order to transmit the light which the optical semiconductor element 11 emits or receives, the adhesive resin 13 has transparency at approximately the same degree as that of the covering layer 12. It is also possible to employ an adhesive tape as the adhesive resin 13. In addition, it is also possible to constitute a hollow structure by forming the adhesive resin only at the peripheral portion of the optical semiconductor element 11.

An insulating layer 14 has a function to cover a face of the optical semiconductor element 11 where the circuit portion 21 is not formed. The rewiring patterns 15 are allowed to elongate to an upper face of the insulating layer 14, where the terminal portions 17 are formed on the rewiring patterns 15. For the material of the insulating layer 14, a resin or the like with insulating properties can be employed generally, and similarly to the covering layer 12, glass or acrylic resin can also be employed.

The terminal portions 17 have a function to electrically connect the outside and the rewiring patterns 15 elongating past the insulating layer 14 up to the back side of the optical semiconductor element 11. One end of each of the terminal portions 17 is connected to each of the rewiring patterns 15, and the other end thereof is exposed from the sealing resin 16. The terminal portions 17 are made of a conductive member, for which the same material as the rewiring patterns 15 can be employed. An outer face of the sealing resin 16 where the terminal portions 17 are exposed and the exposed faces of the terminal portions 17 are positioned on the same plane. The bump electrodes 18, which are made of a solder material, are adhered to the exposed terminal portions 17.

A description will be given of the optical semiconductor device 10B of another configuration with reference to FIG. 1B. A basic configuration of the optical semiconductor device 10B shown in FIG. 1B is similar to that of the optical semiconductor device 10A described above but different therefrom in the elongating structure of the rewiring patterns 15 up to the back of the optical semiconductor element 11. Focusing on this different point, the configuration of the optical semiconductor device 10B will be described below.

The rewiring patterns 15 are electrically connected with the circuit portion 21 provided on the surface of the optical semiconductor element 11. In this embodiment, the rewiring patterns 15 exist only on the surface of the optical semiconductor elemental. The optical semiconductor element 11 is perforated at positions where the rewiring patterns 15 are formed with via holes for penetrating electrodes which penetrate the element. These via holes are filled with a conductive material, thereby forming posts 19.

The posts 19 penetrate the optical semiconductor element 11 and the insulating layer 14, and one end of each of the posts 19 is electrically connected with each of the rewiring patterns 15. The other end of each of the posts 19 serves as the terminal portion 17 and is exposed from the sealing resin 16 to the outside. The bump electrodes 18 are formed on the exposed faces of the terminal portions 17. That is, since the rewiring patterns 15 and the bump electrodes 18 are electrically connected by the posts 19, they can be connected with the shortest distance therebetween. In addition, a surface of each of the posts 19 is covered with an insulating resin, thus achieving insulation from the inner wall of the optical semiconductor element 11.

An advantage of the embodiment exists in that the side faces of the optical semiconductor element 11 and of the covering layer 12 are covered with the sealing resin 16. To be more specific, the covering layer 12 is adhered to the surface of the optical semiconductor element 11, and the sealing resin 16 covers the side faces of both of them. Furthermore, an interface portion between the optical semiconductor element 11 and the covering layer 12 is also covered with the sealing resin 16. Accordingly, it is possible to prevent water from entering the inside of the optical semiconductor device 10 from the interface portion between the optical semiconductor element 11 and the covering layer 12.

Moreover, the sealing resin 16 seals the entire optical semiconductor element 11 including the back thereof. Accordingly, since the components exposed to the outside, except the covering layer 12 and the terminal portion 17, are covered with the sealing resin 16, it is possible to further improve the moisture resistance and the like of the optical semiconductor device 10.

Furthermore, when the rewiring patterns 15 detour along the side surfaces of the optical semiconductor element 11 and are connected to the terminal portions 17 as shown in FIG. 1A, the rewiring patterns 15 formed on the side face portions of the optical semiconductor element 11 are protected by the sealing resin 16. Accordingly, it is possible to prevent breakage of the rewiring patterns 15.

Next, a description will be given of a method of manufacturing the optical semiconductor device 10 with reference to FIGS. 2A to 6D. The method of manufacturing the optical semiconductor device 10 according to the present embodiment includes the steps of preparing a wafer 20 on a surface of which a plurality of the circuit portions 21 including light-receiving or light-emitting elements are formed; separating the wafer 20 into the individual optical semiconductor elements 11 by forming separating grooves 24 from the back of the wafer 20 so that the wafer 20 is separated; providing the terminal portions 17 electrically connected with the circuit portions 21 on the backs of the optical semiconductor elements 11; forming the sealing resin 16 so that at least the separating grooves 24 are filled with the sealing resin 16; and separating the individual optical semiconductor devices 10 from each other along the separating grooves 24. Each of these steps will be described below.

A description will be given first of a method of manufacturing the optical semiconductor device 10A shown in FIG. 1A with reference to FIGS. 2A to 5C.

Figure 2A:
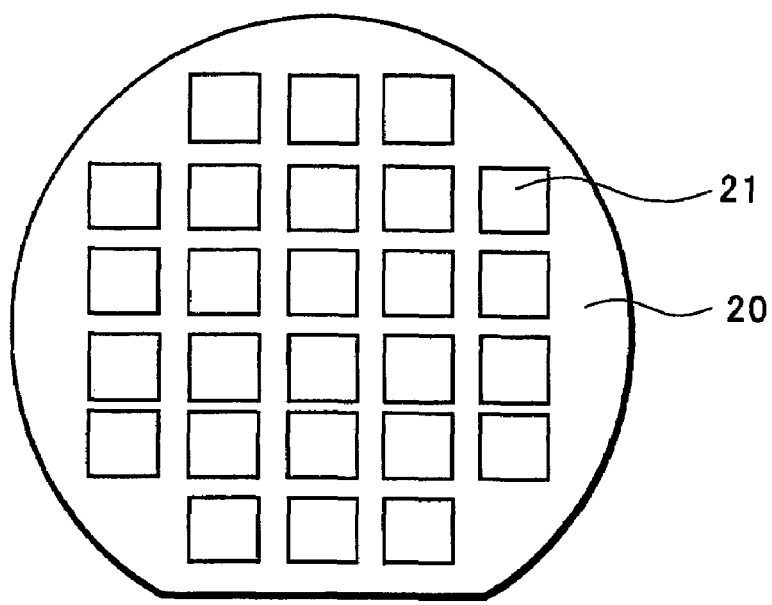
FIGS. 2A and 2B are a plan view and a sectional view, respectively, showing a method of manufacturing the optical semiconductor device of the present invention.
Figure 2B:
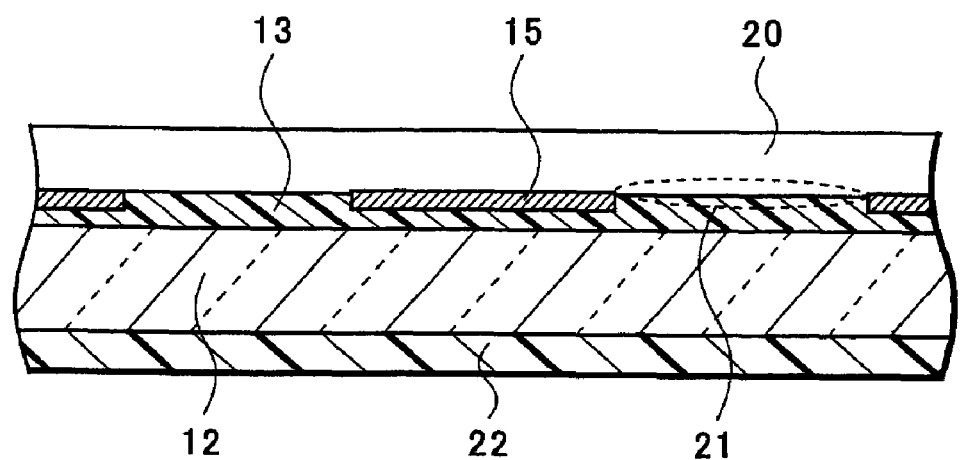

First, referring to FIGS. 2A and 2B, the wafer 20 is prepared, on the surface of which a plurality of the circuit portions 21 including light-receiving or light-emitting elements are formed, and then the transparent covering layer 12 is adhered onto the surface of the wafer 20 so as to cover the circuit portions 21.

Referring to FIG. 2A, a large number of the circuit portions 21 are formed in matrix through a diffusion process and the like on the wafer 20 made of a semiconductor such as silicon. An identical circuit including a light-receiving or light-emitting element is formed for each circuit portion 21. Moreover, each of the circuit portions 21 is electrically connected with the rewiring patterns 15.

Referring to FIG. 2B, the covering layer 12 is adhered with the adhesive resin 13 onto the face of the wafer 20 where the circuit portions 21 are formed. For the covering layer 12, transparent glass, acrylic resin or the like can be employed. For the adhesive resin 13, transparent epoxy resin or the like can be employed. In addition, a sheet 22 is adhered onto a surface of the covering layer 12. With this sheet 22, it is possible to prevent the covering layer 12 from being damaged in the subsequent processes. Moreover, it is also possible to prevent the optical semiconductor devices 10 from coming apart until the last process. The wafer 20 may be thinned by abrading, such as grinding, or etching of the back of the wafer 20.

Figure 3A:
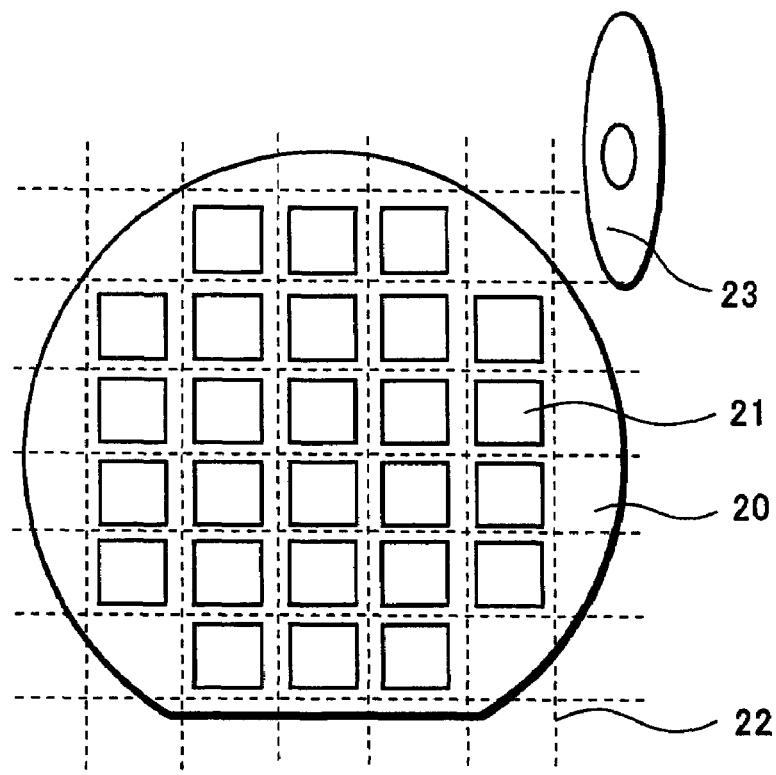
FIGS. 3A and 3B are a plan view and a sectional view, respectively, showing the method of manufacturing the optical semiconductor device of the present invention.
Figure 3B:
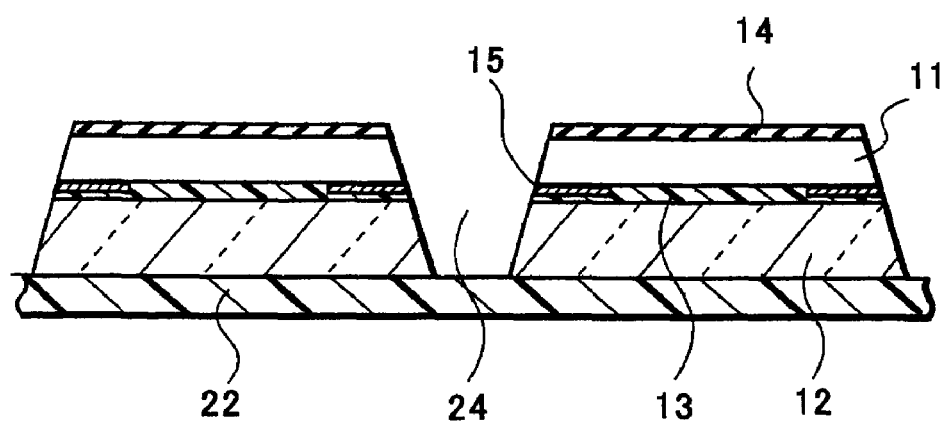

Next, referring to FIGS. 3A and 3B, the wafer 20 is separated into the individual optical semiconductor elements 11 by forming the separating grooves 24 from the back of the wafer 20 so that the wafer 20 is separated.

Referring to FIG. 3A, dicing is performed along dicing lines 22 that are the borders between the circuit portions 21 by use of a dicing blade 23.

Referring to FIG. 3B, a section which has been made by dicing will be described. The depth to be made by dicing is set to such a depth or more that at least the wafer 20 is divided to form the individual optical semiconductor elements 11. In this embodiment, dicing is performed so that both the wafer 20 and the covering layer 12 are divided. Moreover, the adhesive resin 13 and the rewiring patterns 15 are also subjected to the dicing in portions corresponding to the dicing lines 22. The side faces of the optical semiconductor elements 11 and of the covering layers 12 are formed to be inclined faces. The fact that the side faces of the optical semiconductor elements 11 are inclined faces facilitates the formation of the rewiring patterns 15 on the side face portions of the optical semiconductor elements 11 in the subsequent processes. The dicing may be performed to such an extent that the sheet 22 is partly cut. Even if the covering layers 12 and the optical semiconductor elements 11 are separated, since the covering layers 12 are adhered to the single sheet 22, there is a merit that the devices do not come apart until the last process.

In addition, the back of each of the optical semiconductor elements 11 is protected by the insulating layer 14. After the insulating layer 14 is formed over all, dicing may be performed for simultaneously with the other members. Alternatively, the insulating layer 14 may be formed after dicing is performed.

Figure 4A:
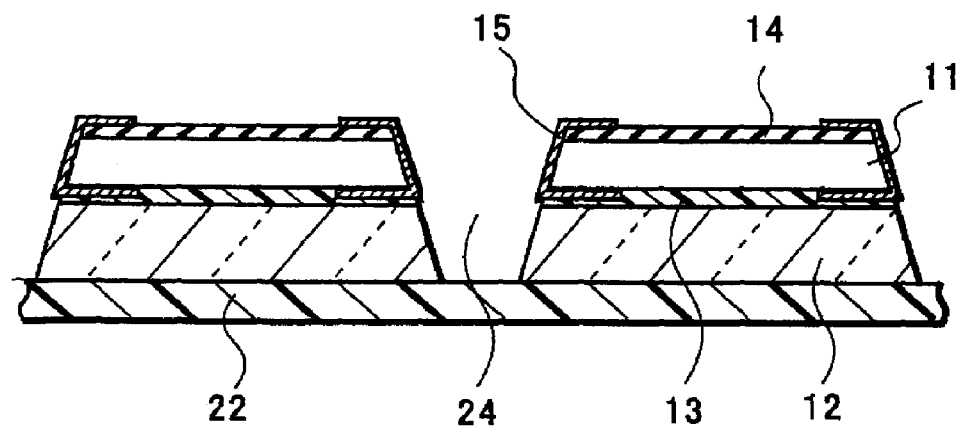
FIGS. 4A and 4B are sectional views showing the method of manufacturing the optical semiconductor device of the present invention.
Figure 4B:
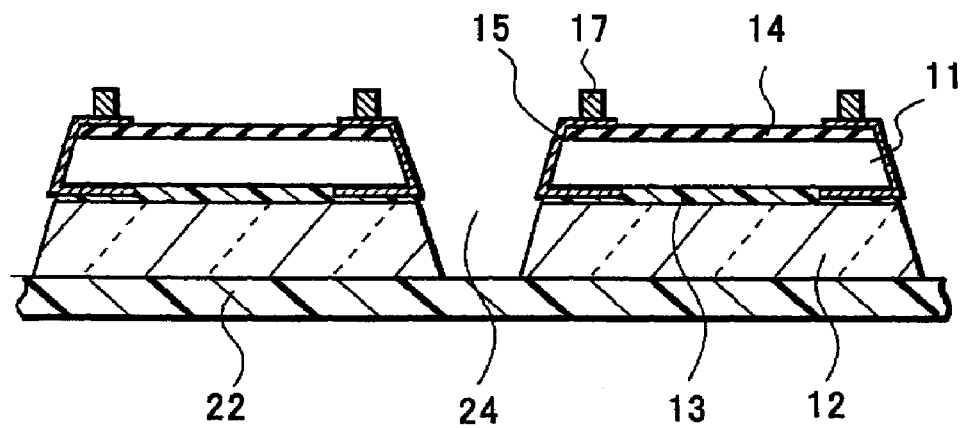

Next, referring to FIGS. 4A and 4B, the terminal portions 17 electrically connected with the circuit portions 21 are provided on the back surface of the optical semiconductor elements 11.

Referring to FIG. 4A, the rewiring patterns 15 are allowed to elongate up to the upper faces of the insulating layer 14. The material of the rewiring patterns 15 is Al, Ag, Au, Pt, Pd, conductive paste, or the like, and the rewiring patterns 15 are formed by evaporation, sputtering, deposition such as CVD under low or high vacuum, electroplating, electroless plating, sintering, or the like. Here, the side face portions of the optical semiconductor elements 11 are inclined faces, which facilitates the formation of the rewiring patterns 15 using the above-mentioned method. When the rewiring patterns 15 are formed by sputtering in particular, it is possible to more surely perform the deposition of the material owing to the fact that the side faces of the optical semiconductor elements 11 are inclined faces.

Referring to FIG. 4B, the terminal portions 17 electrically connected with the rewiring patterns 15 are formed. The formation of the terminal portions 17 can be performed, for example, by arraying solder balls using a transfer method.

Figure 5A:
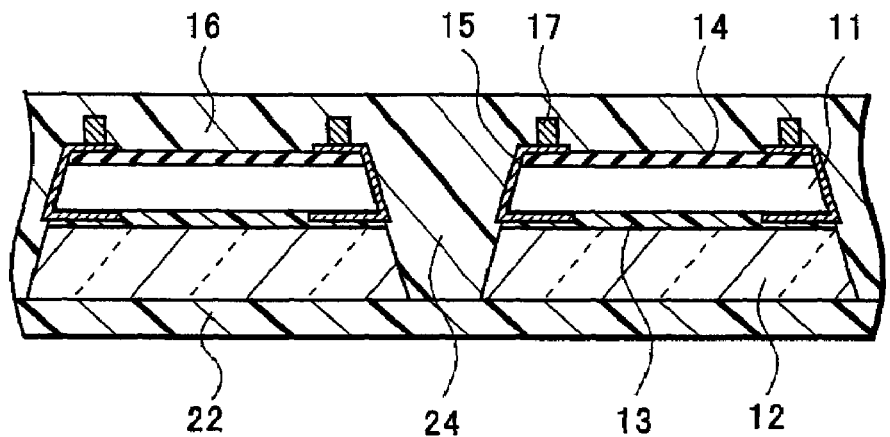
FIGS. 5A to 5C are sectional views showing the method of manufacturing the optical semiconductor device of the present invention.
Figure 5B:
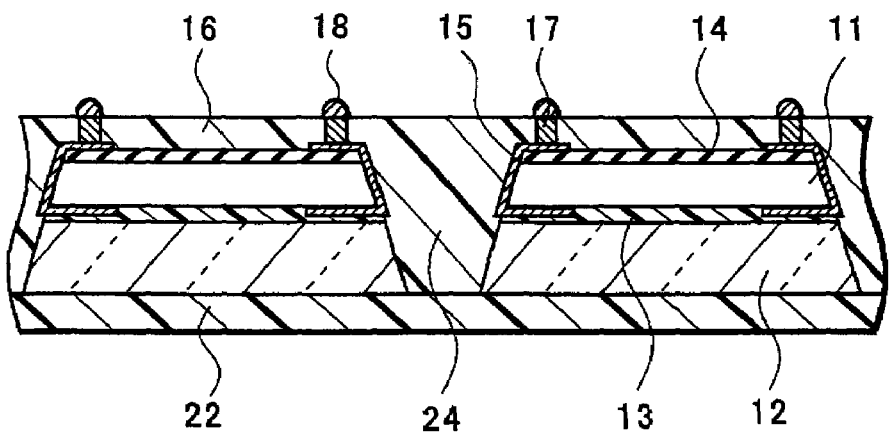
Figure 5C:
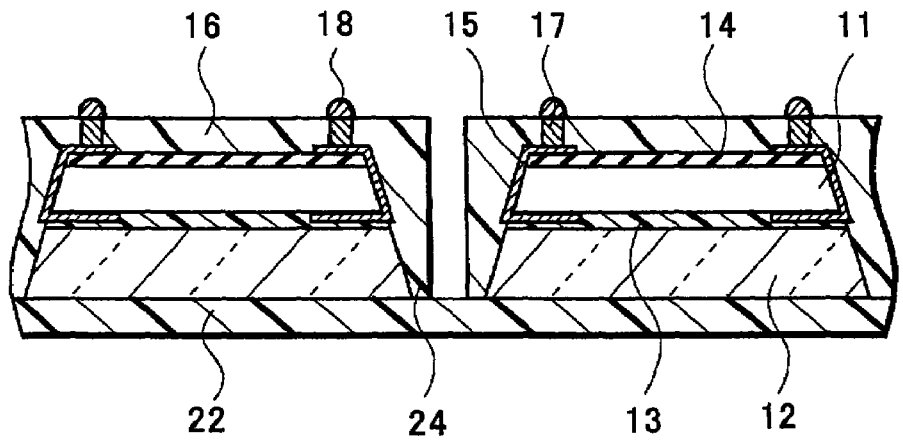

Next, referring to FIGS. 5A to 5C, the sealing resin 16 is formed so that at least the separating grooves 24 are filled with the sealing resin 16, and then the individual optical semiconductor devices 10 are separated from each other along the separating grooves 24.

Referring to FIG. 5A, the sealing resin 16 is formed so as to fill the separating grooves 24 and cover the terminal portions 17. In this embodiment, the sealing resin 16 is formed so as to cover the entire wafer 20. The formation of the sealing resin 16 can be performed by a sealing or casting method using a mold, vacuum printing, or the like.

Referring to FIG. 5B, the terminal portions 17 are exposed from the sealing resin 16. This process can be performed by grinding the sealing resin 16 by use of a grinding attachment. Accordingly, an upper face of the resultant, which is formed of the sealing resin 16, is formed to be a planer face, making a structure in which the terminal portions 17 are exposed from this face. The bump electrodes 18 made of solder or the like are formed on the exposed terminal portions 17. In addition, the exposed terminal portions 17 may be plated, and ball electrodes may be formed on the exposed terminal portions 17.

Finally, referring to FIG. 5C, dicing is performed along the separating grooves 24, thus separating the optical semiconductor devices from each other. Since only the sealing resin 16 is cut in this dicing, a process can be realized where abrasion on the dicing blade is reduced. Thereafter, a process of testing and the removal of the sheet 22 are performed to complete the optical semiconductor devices 10A, for example, as shown in FIG. 1A.

Additionally, when manufacturing the optical semiconductor devices 10B as shown in FIG. 1B, a process of forming the posts 19 by providing the via holes in the optical semiconductor elements 11 is added instead of the aforementioned process of allowing the rewiring patterns 15 to elongate up to the backs of the optical semiconductor elements 11. The other processes are the same as those which were described above.

The above description has been given of the optical semiconductor devices and the manufacturing methods thereof according to the present embodiment. However, various changes may be made without departing from the spirit of the present embodiment.

Figure 6A:
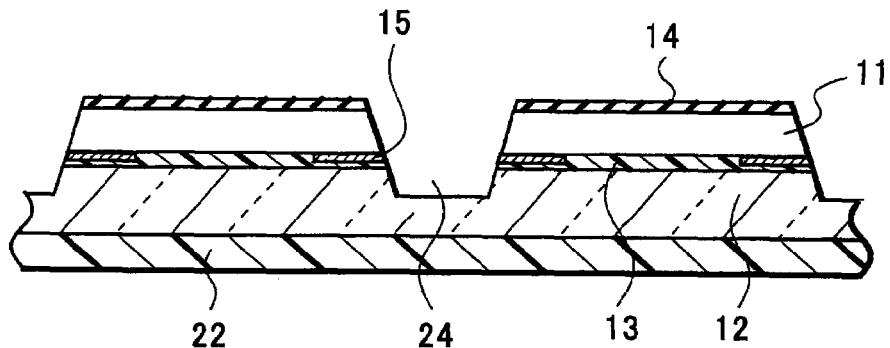
FIGS. 6A to 6D are sectional views showing another method of manufacturing the optical semiconductor device of the present invention.
Figure 6B:
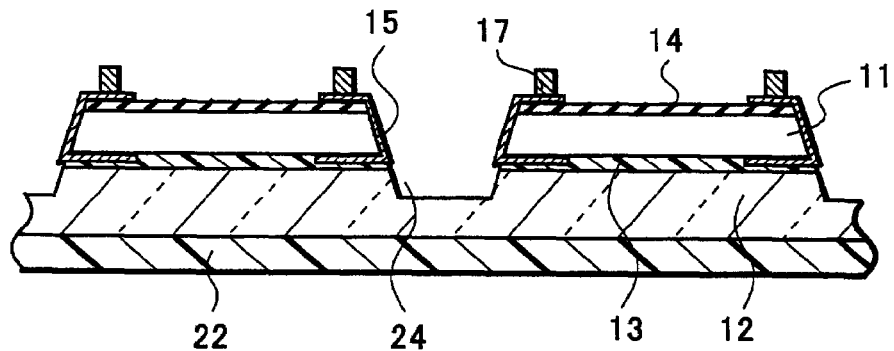
Figure 6C:
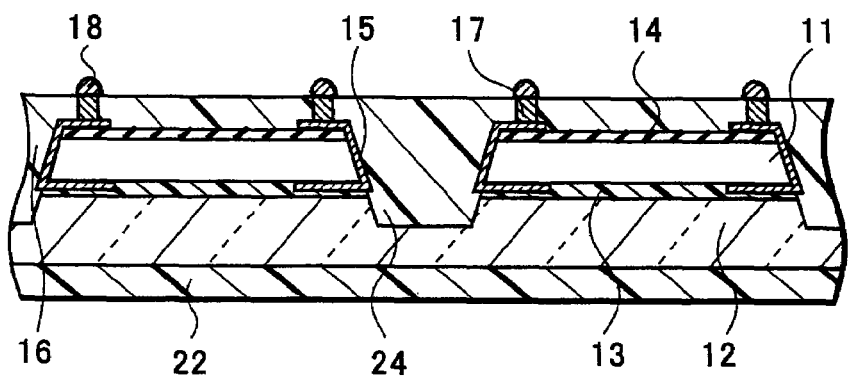
Figure 6D:
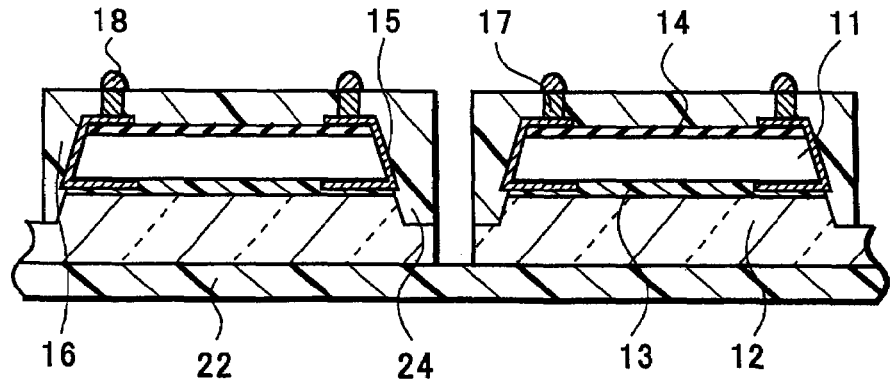
Figure 7:
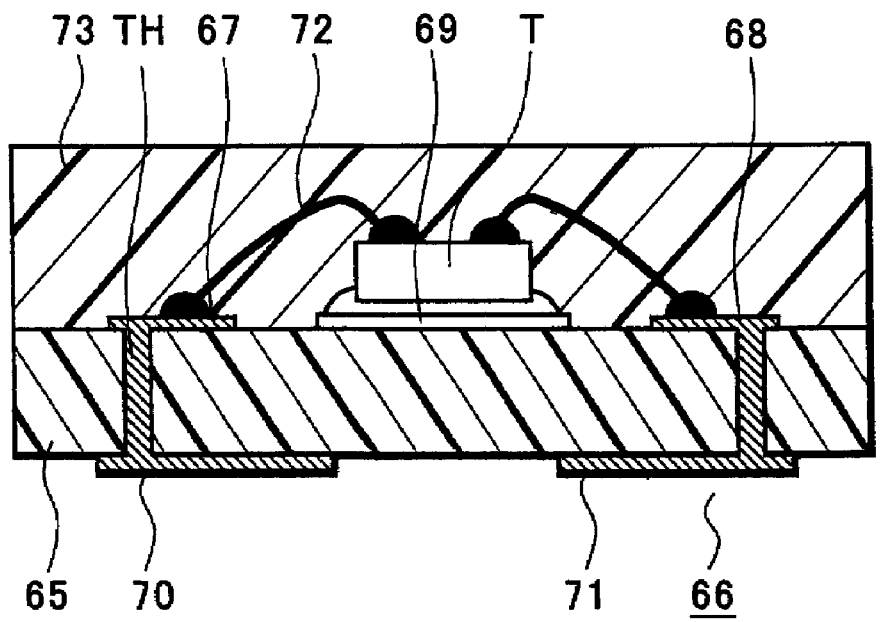
FIG. 7 is a sectional view showing a conventional optical semiconductor device.

For example, referring to FIGS. 6A to 6D, it is possible to provide the separating grooves 24 to such an extent that the covering layer 12 is not divided in the process of separating the wafer 20. FIG. 6A shows a process of separating the wafer 20 into the optical semiconductor elements 11 by dicing; FIG. 6B shows a process of allowing the rewiring patterns 15 to elongate up to the backs of the optical semiconductor elements 11 and providing the terminal portions 17; FIG. 6C shows a state where, after sealing with resin, the terminal portions 17 are exposed therefrom and the bump electrodes 18 are formed on the terminal portions 17; and FIG. 6D shows a state where the sealing resin 16 and the covering layer 12 are subjected to dicing at the separating grooves 24, thus separating the individual optical semiconductor devices 10 from each other.

The prevent embodiment can have beneficial effects as follows.

In the optical semiconductor device of the present embodiment, since the side faces of the covering layer 12 and of the optical semiconductor element 11 are protected by the sealing resin 16, it is possible to provide the optical semiconductor device 10 of which the moisture resistance, heat resistance, and mechanical strength are improved. Moreover, since part of the rewiring patterns 15 elongating along the side faces of the optical semiconductor element 11 is protected by the sealing resin 16, it is possible to make a structure in which the rewiring patterns 15 are prevented from breaking.

In the method of manufacturing the semiconductor device of the present embodiment, since the processes of dicing and like are performed after the wafer 20 is adhered onto the sheet 22 including the covering layer 12, there is a merit that the optical semiconductor devices 10 do not come apart until the last process. Moreover, since only the sealing resin 16 is subjected to dicing by use of a dicing blade in the last process of dicing to separate the optical semiconductor devices 10 from each other, it is possible to reduce the abrasion on the dicing blade. Furthermore, since the surface of the covering layer 12 is covered with the sheet 22, it is possible to prevent the surface of the covering layer 12 from being damaged. In addition, it is possible to use the single sheet 22 as a protect sheet and as a dicing sheet in common.

What is claimed is:

1. A semiconductor device, comprising:
    a semiconductor element;
    a first conductive electrode, wherein the first conductive electrode is electrically connected to a circuit on a front surface of the semiconductor element;
    a penetrating region extending from the front surface to a back surface of the semiconductor element in a manner substantially perpendicular to the front and back surfaces of the semiconductor element, wherein the penetrating region is over the first conductive electrode;
    a second conductive electrode inside the penetrating region and electrically connected to the first conductive electrode;
    a transparent cover on the front surface of the semiconductor element, wherein a side surface of the transparent cover and a side surface of the semiconductor element are on the same plane; and
    a sealing resin, wherein the resin covers and is in direct contact with the side surface of the semiconductor element and the side surface of the transparent cover and a thickness of the sealing resin in direct contact with the side surface of the semiconductor element is greater than a thickness of the sealing resin in direct contact with the side surface of the transparent cover.

2. The device of claim 1 wherein the second conductive electrode is connected to a terminal portion on the back surface of the semiconductor element.

3. The device of claim 1 further comprising adhesive resin between the semiconductor element and the cover.

4. The device of claim 1 wherein the second conductive electrode comprises a conductive material.

5. A semiconductor device, comprising:
    a semiconductor element;
    a circuit on a front surface of the semiconductor element, wherein the circuit includes at least one of a light receiving element and a light emitting element;
    a first conductive electrode on the front surface of the semiconductor element and electrically connected to the circuit;
    a penetrating region extending from the front surface to a back surface of the semiconductor element in a manner substantially perpendicular to the front and back surfaces of the semiconductor element, wherein the penetrating region is over the first conductive electrode;

a second conductive electrode inside the penetrating region and electrically connected to the first conductive electrode;

a transparent cover on the front surface of the semiconductor element, wherein a side surface of the transparent cover and a side surface of the semiconductor element are on the same plane; and a sealing resin, wherein the resin covers and is in direct contact with the side surface of the semiconductor element and the side surface of the transparent cover and a thickness of the sealing resin in direct contact with the side surface of the semiconductor element is greater than a thickness of the sealing resin in direct contact with the side surface of the transparent cover.

6. The device of claim 5 wherein the second conductive electrode is connected to a terminal portion on the back surface of the semiconductor element.

7. The device of claim 5 further comprising adhesive resin between the semiconductor element and the cover.

8. The device of claim 5 wherein the second conductive electrode comprises a conductive material.

9. The device of claim 1 wherein a front surface of the transparent cover and a front surface of the sealing resin are in the same plane.

10. The device of claim 5 wherein a front surface of the transparent cover and a front surface of the sealing resin are in the same plane.

11. The device of claim 1 further comprising an insulating layer between and in contact with both the sealing resin and the back surface of the semiconductor element.

12. The device of claim 5 further comprising an insulating layer between and in contact with both the sealing resin and the back surface of the semiconductor element.

13. The device of claim 1 wherein the sealing resin covers the back surface of the semiconductor element.

14. The device of claim 1 wherein the sealing resin is in direct contact with the side surface of the semiconductor element and the side surface of the transparent cover.

15. The device of claim 5 wherein the sealing resin covers the back surface of the semiconductor element.

16. The device of claim 5 wherein the sealing resin is in direct contact with the side surface of the semiconductor element and the side surface of the transparent cover.

17. The device of claim 11 further comprising a terminal portion electrically connected to the second conductive electrode, the terminal portion extending from the back surface of the semiconductor element through the insulating layer and the sealing resin.

18. The device of claim 12 further comprising a terminal portion electrically connected to the second conductive electrode, the terminal portion extending from the back surface of the semiconductor element through the insulating layer and the sealing resin.

* * * * *